United States Patent [19]

Storar

[11] 3,930,252

[45] Dec. 30, 1975

[54] BIPOLAR DUAL-SLOPE ANALOG-TO-DIGITAL CONVERTER

[75] Inventor: Robert C. Storar, Xenia, Ohio

[73] Assignee: United Systems Corporation, Dayton, Ohio

[22] Filed: Dec. 26, 1973

[21] Appl. No.: 427,953

[52] U.S. Cl. .......................... 340/347 NT; 324/99 D

[51] Int. Cl.$^2$ .......................................... H03K 13/20

[58] Field of Search .................. 340/347 NT, 347 AD, 347 DA; 324/99 D; 235/92 EA; 177/165, 210, DIG. 3

[56] References Cited

UNITED STATES PATENTS

| | | | |
|---|---|---|---|
| 2,798,667 | 7/1957 | Spielberg et al. | 235/154 X |
| 2,824,285 | 2/1958 | Hunt | 340/347 NT |
| 2,951,203 | 8/1960 | Tillman et al. | 340/347 AD |
| 3,051,939 | 8/1962 | Gilbert | 340/347 NT |
| 3,111,662 | 11/1963 | Pierce | 340/347 AD |
| 3,293,416 | 12/1966 | Chrisholm et al. | 235/92 EA |
| 3,316,547 | 4/1967 | Ammann | 340/347 NT |
| 3,368,149 | 2/1968 | Wasserman | 340/347 NT |
| 3,475,749 | 10/1969 | Plice | 340/347 DA |
| 3,488,588 | 1/1970 | Deavenport et al. | 340/347 NT X |
| 3,540,037 | 11/1970 | Ottesen | 340/347 DA |
| 3,544,994 | 12/1970 | Hanson et al. | 340/347 DA |
| 3,577,084 | 5/1971 | Atcherson et al. | 340/347 AD X |
| 3,588,530 | 6/1971 | Langan | 340/347 DA X |
| 3,665,305 | 5/1972 | Petrohilos | 324/99 D |
| 3,703,001 | 11/1972 | Hibbs | 340/347 NT |
| 3,710,374 | 1/1973 | Kelly | 340/347 AD |
| 3,733,600 | 5/1973 | Hellwarth et al. | 340/347 NT |
| 3,747,089 | 7/1973 | Sharples | 340/347 AD |
| 3,777,121 | 12/1973 | Jamieson | 235/92 EA |
| 3,777,828 | 12/1973 | Dietemeyer | 340/347 NT X |

OTHER PUBLICATIONS

Analog Devices, Inc., "Analog–Digital Conversion Handbook," 1972, pp. II–48,49.

*Primary Examiner*—Thomas J. Sloyan
*Attorney, Agent, or Firm*—Peter S. Gilster

[57] ABSTRACT

A bipolar analog-to-digital converter system is disclosed which is particularly suited as a digital volt meter or digital multimeter. The system includes an integrator and a solid state switching circuit alternately connecting to and is directly proportional to the integrator either an analog input signal of unknown magnitude and of either polarity or an analog reference signal of preselected magnitude and fixed polarity. A pulse generator supplies pulses at a constant rate to a digital counter. Provision is included for resetting the counter to a predetermined first count and for causing the switching means to apply the input signal to the integrator so that its output signal increases linearly from a reset value while the counter advances from the first count to a predetermined second count. Circuitry responsive to the second count causes the switching circuit to apply the reference signal to the integrator so that its output signal decreases linearly toward the reset value while the counter advances from the second count toward a predetermined third count. The reset value is reached prior to the third count for an analog input signal of a first polarity but after the third count if of an opposite polarity. A digital display and associated digital circuitry cause display of a decimal number corresponding to the complement of the count in the counter when the output signal from the integrator reaches the reset value prior to the third count but are responsive to the counter reaching the third count for causing a display of a decimal number corresponding to the true count in the counter when the integrator output signal then reaches the reset value. The decimal number displayed thus digitally corresponds to the true magnitude of the analog input signal.

27 Claims, 2 Drawing Figures

BIPOLAR DUAL-SLOPE ANALOG-TO-DIGITAL CONVERTER

BACKGROUND OF THE INVENTION

This invention relates generally to analog-to-digital signal conversion systems and more particularly to such systems of the bipolar type, i.e., those which convert either positive or negative analog input signals.

The present disclosure is especially concerned with analog-to-digital (A-to-D) converters of the type used for digital volt meters (DVM's) or digital multimeters which indirectly, through time integration, first convert an analog input signal to a function of time and subsequently convert by means of a digital counter from the time function to a digital number representative of the magnitude of the analog input signal.

Among such integration converters, one of two different techniques has typically been employed, viz., the so-called single slope technique or the so-called dual slope technique.

In the single slope (sometimes referred to as single ramp) converter, a reference voltage of polarity opposite to the analog input signal is integrated until the integrator output equals the signal input. The time required for such integration is proportional to the ratio of the input signal to the reference voltage. A counter is typically employed to count clock pulses during the integration and the number of counts of the counter then represents a digital number which is proportional to this ratio. This technique has several disadvantages which are well known to those skilled in the art.

In a dual slope (sometimes referred to as dual ramp) converter, the analog input signal is supplied to an integrator. At the end of this period, the integrator has accumulated a charge which is proportional to the average value of the input over the time interval. After this predetermined period (which may be determined by a counter which counts clock pulses), a reference voltage having polarity opposite to the analog input signal is applied to the integrator. The integrator provides an increasing slope or ramp. The reference potential is then integrated to produce a decreasing ramp having a slope which is proportional to the reference potential. When the integrator output reaches zero potential, the counter is stopped, the number of counts on the counter representing a time interval. The ratio of this second interval to the first interval is proportional to the ratio of the analog input signal to the reference potential.

The dual slope integration techniques offer numerous advantages, particularly that of improving conversion accuracy such as those resulting from changes in the value of circuit components and shift in clock frequency. Accordingly, the dual slope integration technique has been widely employed, particularly in the test and measurement field.

In this field, it is typically advantageous to employ A-to-D converters of the bipolar type. Since analog signals of either polarity are likely to be encountered, it is desired that the converter be capable of measuring the magnitude of the analog input signal regardless of its polarity (and also indicate the polarity). Heretofore, bipolar A-to-D converters have required either polarity sensing circuits or other complicated polarity determination circuitry or they have required the use of two reference sources of opposite polarity, with switching between the two sources dependent upon the polarity of the input signal.

Among the disadvantages of two reference sources are the need for a multiplicity of circuits and parts with necessity critical component value tolerances, and the necessity for extra calibration adjustment. Thus, there have been attempts to eliminate dual reference sources in bipolar A-to-D converters.

In one such type of prior art converter, the analog input signal is supplied to the integrator by a full-wave rectifier bridge. Hence, the input signal may be of either polarity. While using a single reference voltage, this type of converter requires that the integrator circuitry be rebalanced before each measurement and the additional circuitry for accomplishing this adds cost and complexity and so is undesirable.

Another prior art bipolar converter, although of the single slope type, proposed the use of a reference voltage which was offset from zero voltage in order to create artificially dual reference potentials. However, this zero offset technique can result in errors from temperature changes or other shifts in component values and may require temperature and drift compensation networks which are undesirable.

Among the prior art may be noted the following references: U.S. Pat. Nos. 2,824,285; 2,885,663; 2,951,203; 3,051,939; 3,111,662; 3,316,547; 3,449,741; 3,488,588; 3,665,305; 3,703,001; Sheingold, et al., "Understanding Converter Circuitry," IEEE Spectrum, October, 1972; and Propster, "Analog to Digital Converter," IBM Technical Disclosure Bulletin, Vol. 5, No. 8, (January, 1963).

SUMMARY OF THE INVENTION

Among the objects of the present invention may be noted the provision of an improved bipolar analog-to-digital converter; a provision of such a converter of the dual slope type; the provision of such a converter employing a single reference source; the provision of such a converter which does not require analog polarity determining or analog polarity sensing circuits but which nevertheless converts an analog input signal of either polarity, the polarity being unknown, to a digital number which is directly proportional to said analog input signal, and displays such digital number; the provision of such a converter which does not require complicated compensation or rebalancing circuitry and is easily calibrated and constructed; the provision of such a converter employing relatively few components and which is, therefore, quickly and economically assembled; the provision of such a converter including provision for indicating an analog input signal of overrange magnitude; the provision of such a converter which indicates the polarity of the analog input signal; and the provision of such a converter which is highly accurate, extremely stable, highly reliable and long lasting in operation.

Briefly, a bipolar analog-to-digital converter system of the present invention comprises an integrator providing an output signal which is proportional to the integral with respect to time of a signal applied to the input thereof and solid state switching means for alternately connecting to the input of the integrator either a first signal corresponding to an analog input signal of unknown magnitude and of either positive or negative polarity or a second signal constituting an analog reference signal of preselected magnitude and of fixed polarity. A pulse generator supplies pulses at a substantially constant pulse repetition rate, there being a digital counter for counting the pulses. Means is included for periodically resetting the counter to a predetermined first count and for causing the switching means to apply the first signal to the input of the integrator whereby the output signal from the integrator increases linearly with respect to time from a reset value while the counter advances from the first count to a predetermined second count. Means is responsive to the second count for causing the switching means to apply the second signal to the input of the integrator whereby the output signal from the integrator decreases linearly with respect to time toward the reset value while the counter advances from the second count toward a predetermined third count, the reset value being reached prior to the third count for a first polarity analog input signal and being reached after the third count for an opposite polarity analog input signal. The system includes digital display means and count responsive means for causing the digital display to display a decimal number corresponding to the complement of the count in the counter upon the output signal from said integrator reaching the reset value. The count responsive means also includes true count means for causing the digital display means to display a decimal number corresponding to the true count in the counter upon the output signal from the integrator reaching said reset value and means responsive to the counter reaching the third count for disabling the complement count means and enabling the true count means. The decimal number displayed by said display means accordingly digitally represents the true magnitude of the analog input signal regardless of its polarity. That is, the digital number is directly proportional to the magnitude of the analog input signal.

Other objects and features will be in part apparent and in part pointed out hereinafter.

DESCRIPTION OF THE DRAWINGS

Corresponding reference characters indicate corresponding parts throughout the drawings.

DESCRIPTION OF THE PREFERRED EMBODIMENT

Figure 1:
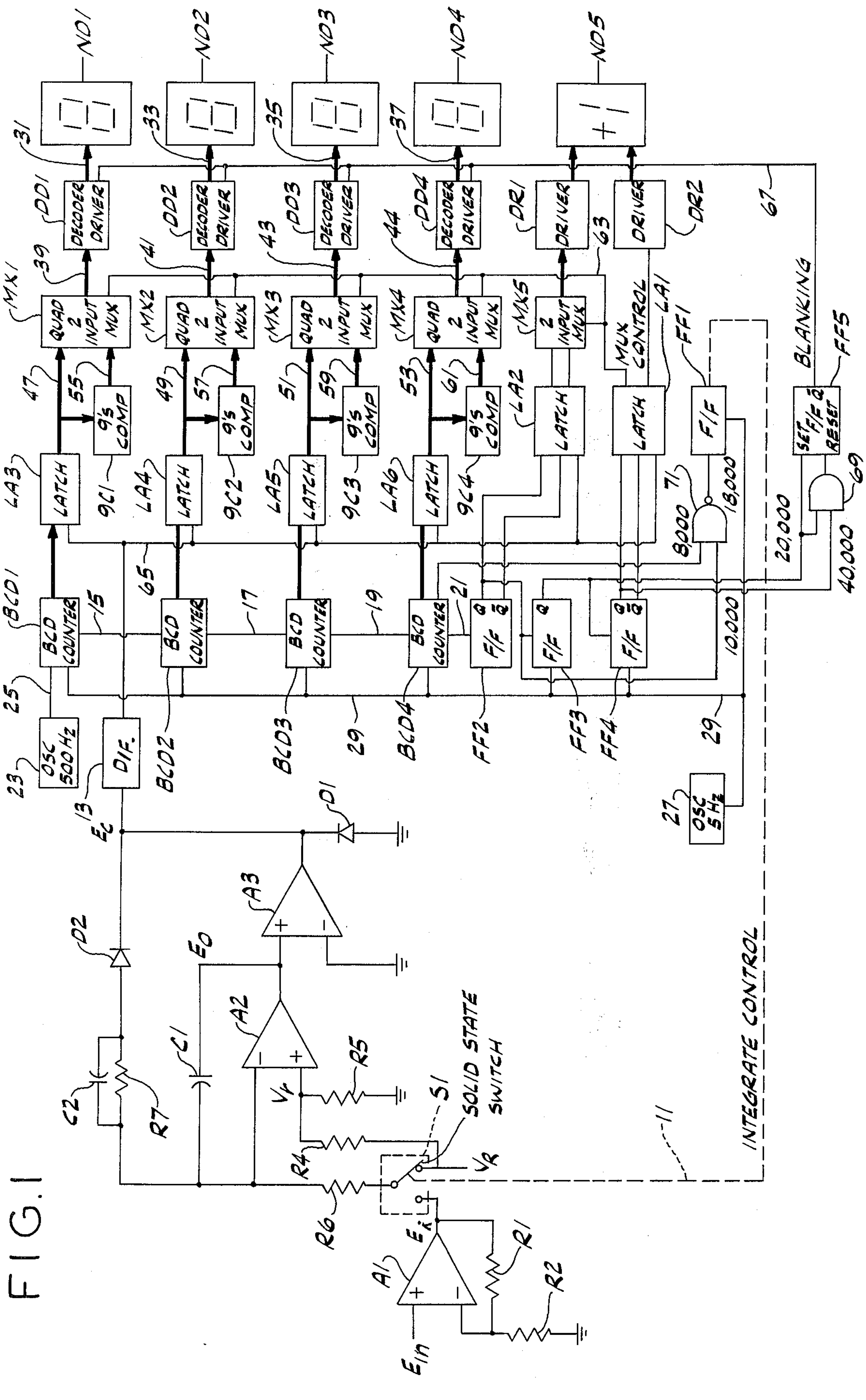
FIG. 1 is a schematic circuit diagram of an analog-to-digital converter of the present invention.

Referring now to FIG. 1, a preferred embodiment of the bipolar A-to-D converter system of this invention is adapted to convert an analog input signal, i.e., a voltage $E_{in}$, of unknown magnitude (but within a preselected range) to a digital form and to display this magnitude digitally as a decimal number. For this purpose, it is preferred to employ multi-segment LED display devices. Illustrated are seven-segment LED numerical display devices ND1, ND2, ND3 and ND4 for the four digits to the right of a decimal point (not shown), each such device being adapted to play digits 1 through 0. These may each be of the commercial type MAN 1A for example, available from Monsanto Commercial Products Company. A four-segment polarity and numerical overflow LED display device ND5 (such as commercial type MAN 1001A from the same source) displays the digit 1 to the left of the decimal point and the polarity (+) or (−) of the input signal. Hence, a number from −1.9999 to +1.9999 can be displayed.

It will be apparent that through use of conventional scaling, rectification, current shunt or current source networks, the input voltage $E_{in}$ may represent an unknown DC or AC voltage or current within a preselected one of several different ranges or may represent a resistance. Thus an A-to-D converter of the invention is useful in the conventional sense for measuring and displaying digitally one of a variety of analog input parameters of unknown magnitude.

The input voltage $E_i$ is applied to an input amplifier constituted by an operational amplifier A1 of the monolithic integrated circuit type and resistors R1 and R2. The purpose of the input amplifier is to scale the input voltage appropriately so as to provide at the output of operational amplifier A1 a voltage $E_i$ proportional to $E_{in}$ and which is of suitable magnitude for conversion. For example, if $E_{in}$ has a full scale of ±1.9999 VDC, the gain of amplifier A1 may be such as to provide a swing of $E_i = \pm 3.1$ VDC.

The input amplifier also provides inpedance buffering between the input to which the voltage $E_{in}$ is applied and other components of the converter. As is conventional, suitable filtering components for controlling transient response rate and clamping or clipping components for overload protection may be employed in conjunction with the input amplifier. Such components are not shown in order to simplify the drawings.

At A2 is designated a second operational amplifier having a capacitor C1 interconnected between the inverting input and the output of the amplifier thus constituting an integrator providing at the output of amplifier A1 an output signal, i.e., a voltage $E_o$, which is proportional to the integral with respect to time of a signal applied to the inverting input of amplifier A2. The integrator acts as a ramp generator, as will become apparent. For this purpose a reference voltage of magnitude $V_r$ is supplied to the noninverting input of amplifier A2. This reference potential is derived from an analog reference source potential of magnitude $V_R$ by a voltage divider comprising resistors R4. and R5. It will be seen that $V_r = KV_R$ where K is a constant equal to R4/(R4 + R5). The reference potential $V_R$ is preferably provided by a regulated power supply. Reference potential $V_R$ may have a closely regulated magnitude of about 6 volts, for example. The constant K is chosen so that $E_i$ has an absolute value less than $KV_R$ (i.e., $V_r$) within the operating range of $E_i$. It should be noted that the integrating capacitor C1 is preferably of a high quality type having repeatable charge-discharge characteristics, i.e., low dielectric hysteresis, in order to avoid error in conversion accuracy due to nonlinearity or asymmetry of the ramp characteristic output signal provided by the integrator.

The input of the integrator has alternately supplied to it through a resistor R6 by means of a solid state switch S1 either the output signal $E_o$ from input amplifier A1 (which signal corresponds to the unknown analog input signal $E_{in}$ to be measured) or the analog reference potential $V_R$. This switching means is preferably a so-called analog switch such as commercially available type AH0162 employing field effect transistors whose conductivity is determined by a control voltage supplied to the switch. This device may be specified as a "low-resistance FET single-pole double-throw switch" and preferably should exhibit low leakage and low drift. A dashed lead L1 is shown symbolically interconnecting the switch S1 and a flip-flop FF1 the state of which controls the position of switch SW1 as explained later.

The output voltage $E_o$ from the integrator is supplied to the noninverting input of another operational amplifier A3 having its inverting input connected to circuitry ground so as to operate as a voltage comparator. A diode D1 is connected between the output of amplifier A3 and ground as a clipper for preventing large negative swings of the output voltage $E_c$ of the comparator. The comparator has a series feedback circuit comprising a capacitor C2 and resistor R7 connected in parallel and a diode D2. This feedback circuit interconnects the inverting input of amplifier A2 and the output of amplifier A3. The comparator and feedback circuit together function as means for maintaining the output signal $E_o$ of the integrator substantially precisely at a reset value following decrease of that signal to this value until resetting of a counter of the converter to a first count as later described.

Resistor R7 and capacitor C2 have values such that they serve as a damping network for critical damping of the feedback signal provided by the feedback circuit. The comparator A3 detects the reset value of the integrator output signal $E_o$ and provides a pulse waveform output signal $E_c$ upon the integrator output signal reaching the reset value. The critical damping network causes the pulse waveform to be a single pulse for reasons which later will be apparent.

A differentiator 13 (which may be constituted by a conventional integrated Schmitt trigger circuit) is provided for differentiating the pulse waveform output signal from the comparator in order to provide a sharply defined pulse for a count transfer purpose which is explained below.

Indicated at BCD1, BCD2, BCD3 and BCD4 are respective resettable binary coded decimal (BCD) decade counters each providing one decade of binary coded decimal counting. These counters, which may be of a suitable commercially available monolithic integrated circuit type, are connected in a serial counting string with the carry output of the first counter BCD1 connected as indicated at 15 to the clock or count input of the next counter BCD2 and so on as shown at 17 and 19. Hence, these counters are adapted to count from 0 through 9999. The last decade counter BCD4 has its carry input interconnected as shown at 21 to the clock or toggle input of a toggle flip-flop FF2. The Q output of the latter is similarly connected to the clock input of another toggle flip-flop FF3, in turn having its Q output connected to the clock input of another toggle flip-flop FF4. Various types of flip-flops, such as the J-K Master-slave type, may be used for the present purposes of course.

This flip-flop and various other logic gates and digital devices of the class described herein having outputs of which are logical functions of the inputs thereto are said to supply an output signal or to be supplied with an input signal when the respective output or input is at a first distinct voltage or current level (a "1" state) as opposed to a second distinct voltage or current level (a "0" state). Positive logic is assumed. The present disclosure contemplates the use of negative edge-triggered devices. As those skilled in the art are aware, logic gates, devices or digital circuits of the type described herein may be replaced by their logical equivalents (through conventional use of logic theory).

Together, decade counter BCD1-BCD-4 and flip-flops FF2-FF4 constitute a digital counter with a total count capacity of 79,999 for counting pulses supplied by a pulse generator or oscillator 23 interconnected as indicated at 25 with the clock input of counter BCD1. Oscillator 23 may be of a suitable conventional type (e.g., a multivibrator) for supplying pulses at a substanatially constant pulse repetition rate, i.e., frequency, at 500 kHz, for example.

At 27 is indicated a similar oscillator but operating at a much lower frequency. Oscillator 27 may be a multivibrator supplying pulses at a relative low pulse repetition rate such as 5 Hz. Its output is connected by a lead 29 to the reset inputs of each of counters BCD1–BCD4 and flip-flops FF1-FF4. Hence, oscillator 27 constitutes means for periodically resetting the digital counter to a predetermined first count, i.e., zero, and for causing (through resetting of flip-flop FF1) switching means S1 to apply the output signal $E_o$ of amplifier A1 to the integrator (amplifier A2).

The LED segments numerical display devices ND1-ND4 are driven by appropriate commercially available BCD-to-7-segment decoder-drivers DD1-DD4 of conventional integrated circuit design and the several leads interconnecting the decoder-drivers and these four displays are indicated symbolically A driver for the digit one of overflow display device ND5 is indicated at DR1. A similar driver DR2 selectively drives the vertical LED segment of the polarity sign, the horizontal or (−) segment being wired for continous energization.

So-called quad 2-input multiplex circuits MX1, MX2, MX3 and MX4 are adapted to provide the BCD inputs (of four bit parallel format) to the respective decoder drivers DD1–DD4. These multiplex circuits may be of a commercial integrated circuit type (which may also be referred to as 4-bit data selectors) which are adapted to selectively provide at the output either one of two sets of 4-bit inputs. The respective outputs of multiplexers MX1–MX4 are indicated at 39, 41, 43 and 45.

Selection by the latter multiplexers of either a first set of respective 4-bit input 47, 49, 51 and 53 or a second set of 4-bit inputs 55, 57, 59 and 61 is controlled by a signal on a multiplex control (select) line 63 constituting the $\bar{Q}$ output of flip-flop FF3. This multiplex control lead also controls the operation of a single bit 2-input multiplex circuit MX5 to supply input data to overflow driver DR1.

The data inputs for latch LA1 are provided by the Q and $\bar{Q}$ outputs of flip-flop FF4. It will be seen that one of the outputs of this latch is provided to polarity sign driver DR2. A latch LA2 of the same type receives the Q and $\bar{Q}$ outputs of flip-flop FF2.

Four-bit latches LA3, LA4, LA5 and LA6 are interconnected with respective ones of counter decades BCD1-BCD4. These latches (and latches LA1 and LA2) are concomitantly operable in response to a transfer signal on a common transfer lead 65 (this signal being a pulse provided by differentiator 13 in response to the integrator output reaching reset value) to transfer the count then present in the counter to the latches and hence to the multiplexers MX1–MX4 either in the form of the counter's true count in BCD form on leads 47, 49, 51 and 53 or in the form of the complement of the count in the counter in BCD form on leads 55, 57, 59 and 61. For this purpose, the nines complement of the count is taken by nines complement circuits 9C1-9C4 of commercial integrated circuit type so that the complement of the count in decades BCD1–BCD4 is supplied by leads 55, 57, 59 and 61 in response to a transfer signal to the latches.

A set-reset flip-flop FF5 has its $\bar{Q}$ output interconnected by a lead 67 with the blanking inputs of each of decoder drivers DD1–DD4 so that numerical displays ND1–ND4 are blanked when the $\bar{Q}$ output is high. The set input of flip-flop FF5 is provided by the Q output of flip-flop FF2 and the reset input by the output of a two-input AND gate 69 whose inputs are the respective Q outputs of flip-flop FF2 and FF4. This blanking circuitry constitutes overrange detecting means for blanking displays ND1-ND4 so as to provide overrange indication when the analog input signal $E_{in}$ is of an overrange magnitude, i.e., of absolute value greater than 1.9999 volts, Such an overrange magnitude is greater than can be represented by the digital display. Flip-flop FF5 is normally set when the counter reaches a predetermined count (the Q output thereby being low) to permit operation of the display devices but is reset when the counter reaches another predetermined count if the reset value of the integrator output is not reached after the first-said count and prior to second-said count.

A two-input NAND gate 71 controls the toggling of flip-flop FF1 in similar fashion. Thus, one input of NAND gate 71 is interconnected with the Q output of flip-flop FF2. It will be understood that, employing negative-edge triggered logic devices, the transition of this Q output to low represents a count of 10,000. The other input is connected with one of the binary-coded outputs of counter BCD4 which represents a count of 8,000. Thus also, the drop of the Q outputs of flip-flops FF3 and 4 represents counts of 20,000 and 40,000. Hence, flip-flop FF5 is set at a count of 20,000 and reset at a count of 60,000 (the latter being detected by AND gate 69).

OPERATION OF THE PREFERRED EMBODIMENT

Figure 2:
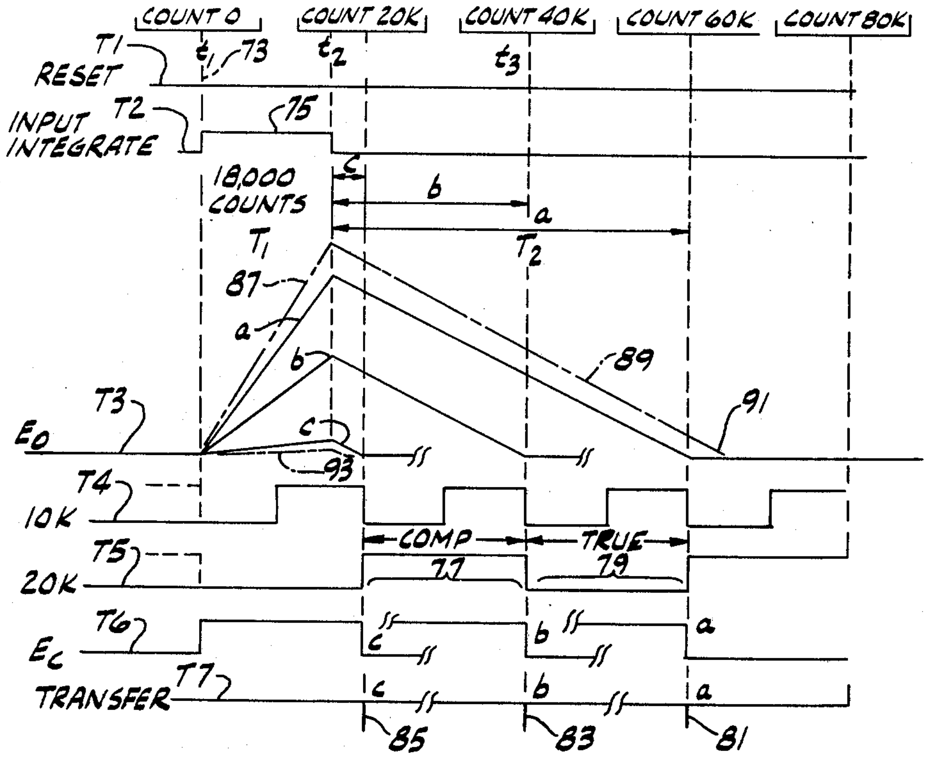
FIG. 2 constitutes a series of traces which are representative of signals at various points in the circuit.

Operation of the present A-to-D converter is best understood by reference to FIG. 2 wherein traces T1–T7 represent various signal levels as a function of time. Specifically, trace T1 represents the output signal (voltage) from oscillator 27; trace T2 represents the time that current is flowing from input amplifier A1 to the integrator; trace T3 represents the output voltage signal $E_o$ of the integrator under three conditions *a*, *b* and *c* corresponding to $E_{in} = -1.9999$, 0 and +1.9999 VDC, respectively; trace T4 represents the voltage level of the Q output of flip-flop FF2; trace T5 represents the voltage level of the Q output of flip-flop FF3; trace T6 represents the output signal (voltage) from comparator amplifier A3; and trace T7 represents the output signal (voltage) from differentiator 13 on transfer lead 65.

A cycle of operation is initiated by a reset pulse from oscillator 27 as indicated in FIG. 2 at 73. This resets the binary counter to a predetermined first count, i.e., zero, and also resets flip-flop FF1 to a state in which solid state switching means S1 connects to the input of integrator (operational amplifier A2) the output signal $E_i$ from input amplifier A1 of magnitude corresponding to that of the unknown analog input signal $E_{in}$.

As the binary counter advances from zero toward a predetermined second count of 18,000 (which is detected by NAND gate 71), the integrator integrates current in a positive sense. This current is proportional to $KV_R - E_i$. Hence, the integrator output voltage $E_o$ has a linear increasing ramp characteristic. Thus, under condition "*a*" (i.e., $E_{in} = -1.9999$ VDC), the output voltage $E_o$ (trace T3) exhibits a steep slope as shown. The slope is less for a more positive input voltage $E_{in}$. For $E_{in}$ having zero voltage, trace T3 has the characteristic identified as "b." For positive input voltages, the slope is even less steep. An input voltage of maximum positive magnitude ($E_{in}$ = +1.9999 VDC), the slope identified by "*c*" is characteristic of trace T3.

At this second count, viz., 18,000 (as indicated at 75 on trace 2) NAND gate 71 sets flip-flop FF1 thereby operating solid state switch S1 to terminate the integration of $E_{in}$ by disconnecting the input signal $E_i$ and instead connecting the reference potential $V_R$ to the integrator. Hence, the integrator now integrates current in a negative sense (current flows toward the switch from the integrator through resistor R6). This current is proportional to $V_R(1 - K)$. Accordingly, the integrator output voltage $E_o$ is now a downward-sloping ramp. As the reference potential remains applied to the integrator, its output voltage continues to decrease linearly toward a reset value (preferably a nominal value of zero volts, although an offset reset value may be employed).

Prior to a predetermined third count (viz., 40,000), the multiplex control lead 63 level is such that the multiplex circuits MPX1–MPX4 select the nines-complemented count data provided by latches LA3–LA6 and at a count of 40,000 select the true count data provided by these latches. It will be seen that, since the $\bar{Q}$ output level changes each 20,000 counts, the multiplex circuits will alternately select the complemented or true count inputs thereto with each 20,000-count interval. Since trace T5 represents the Q output level for flip-flop FF3, it also represents selection operation of multiplex circuits MPX1–MPX4 (as well as MPX5). Thus, period 77 represents complemented data selection, period 79 true data selection, and so on.

As noted previously, the count in the binary counter is not provided by the latch outputs until there is a transfer pulse on lead 65. Comparator amplifier A3 detects the reset value of $E_o$. When this value is reached, the output voltage $E_c$ of amplifier A3 slews rapidly to zero, diode D1 preventing it from swinging substantially less than zero volts. This step-function decrease is effectively differentiated by differentiator 13 to provide a sharp transfer pulse. The comparator output voltage $E_c$ under the three conditions "*a*," "*b*," and "*c*" is represented by trace T5. A transfer pulse under condition "*a*" (full negative analog input magnitude) is indicated at 81, a transfer pulse under condition "*b*" (zero analog input magnitude) is indicated at 83, and a transfer pulse under condition "*c*" (full positive analog input magnitude) is indicated at 85. The critical damping of the feedback of clamp network ensures that the feedback signal is critically damped. Thus, only a single transfer pulse results, as is desirable to prevent erroneous indications or other malfunction of the digital circuitry.

Hence, the transfer pulse is provided when the integrator output voltage (which continues to decrease toward reset value as the counter advances from 18,000 counts toward the predetermined third count of 40,000) reaches its reset value. Accordingly, if this reset value is reached prior to 40,000 counts (*t*3), the latch data is complemented by complement circuits 9C1–9C4, selected by multiplexers MX1–MX4 and displayed by numerical displays ND1–ND5 as a decimal number corresponding to the true magnitude of the analog input signal $E_{in}$. Thus, it will be that an input signal of positive polarity is accurately represented and its polarity is correctly shown by overflow display ND5. If its magnitude is +1.0000 VDC or greater, the digit one segments of the overflow display are energized, since this condition will be detected by latch LA2 and the output data thereof will be selected by operation of multiplexer MX5.

However, if the reset value of the integrator output voltage $E_o$ is reached, causing a transfer pulse, after 40,000 counts ($t_3$), as occurs when a negative analog input signal $E_{in}$ is being measured, then the true count in counters BCD1–BCD4 and provided by latches LA3–LA6 will be selected as the data input by multiplexers MX1–MX4 and hence displayed as the true decimal magnitude by display devices ND1–ND4. The negative polarity is displayed by device ND5. If the negative magnitude is equal to or greater than −1.0000 VDC the unit display of device ND5 is energized to so indicate. From the foregoing, it will be apparent that the state of flip-flop FF4 by interconnection with the counter controls the polarity display. I.e., flip-flop FF4 assumes a first state for causing positive polarity display at a predetermined first count (zero) and assumes its second state for causing negative polarity display at another count, i.e., 40,000.

If the analog input signal is of zero magnitude, it is seen from FIG. 2 that the transfer pulse occurs at $t_3$ (a count of 40,000). Hence, zero magnitude is digitally displayed by devices ND1–ND4.

Another reset pulse initiates another A-to-D conversion cycle. Thus it will be understood that oscillator 27 has a frequency much lower than that of oscillator 23. At a frequency of $5H_z$, it will be seen that five conversions are made per second. It may be noted that reset pulses may be provided by a source other than oscillator 27. For example, a command reset pulse may be externally generated where it is desired to use the present A-to-D converter for a single sample measurement (the reset pulse coinciding with the desired time of measuring the input signal magnitude) rather than the continuous sampling carried out by the preferred embodiment.

Following an analog-to-digital conversion as just described, the converter remains in a quiescent state in which solid state switch S1 continues to connect the integrating resistor R6, and hence the integrator input, to reference voltage $V_R$. The comparator output voltage $E_c$ settles to a value determined by the feedback circuit which includes resistor R7, capacitor C2 and diode D2. In this way, the feedback circuit acts as a clamp network which sinks the current furnished by integrator resistor R6 into the output of the comparator. This has the effect of maintaining the integrator output voltage substantially precisely at its reset value (i.e., substantially zero or, more precisely, equal to the small intrinsic offset potential of the comparator input). This quiescent, clamped condition continues until reset oscillator 27 supplies another reset pulse.

Overrange detecting means of the converter provides indication of an analog input signal of magnitude greater than the preselected value (+1.9999 VDC) which can be represented by the digital display. This is carried out by the blanking means previously described which includes flip-flop FF5 and the associated AND gate 69. As noted, decoder-drivers DD1–DD4 are inhibited by the signal on lead 67 until the counter has a count of 20,000 at which flip-flop FF5 is set ($\bar{Q}$ is low). These decoder-drivers are enabled from count 20,000 until count 60,000. At 60,000, this flip-flop is reset ($\bar{Q}$ is high), once again inhibiting the decoder-drivers. If a transfer pulse occurs at any time during a conversion cycle other than the period beginning at count 20,000 and ending at count 60,000, the transfer pulse will cause only the unit display by display device ND5 while the other display devices ND1–ND4 are blanked. This condition is readily observed as an indication of overrange conditions.

Referring to FIG. 2, it may be seen that a negative input signal of magnitude greater than −1.999 VDC will cause $E_o$ to exhibit the positive scope characteristic indicated by broken line 87. When the integration (in a positive sense) of the input signal is terminated at 18,000 counts and the integrator then integrates (in a negative sense) the reference voltage $V_R$, $E_o$ follows the negative slope characteristic designated 89. Hence, its reset value is not reached until a point 91 at which the count is greater than 60,000. Thus, the resultant transfer pulse at this point in the conversion cycle results in an overrange indication.

Similarly, it may be observed that a positive input signal of greater than +1.9999 VDC results in a transfer pulse prior to a count of 20,000, since $E_o$ follows a characteristic such as that shown at 93.

From the foregoing it will be seen that polarity is thus changed at a count of 40,000. In other words, the number displayed prior to 40,000 counts (but greater than 20,000) must be positive and corresponds to $0 < E_{in} < +1.9999$ v.d.c. For such magnitudes, the number displayed may be regarded as the quantity 40,000 minus the quantity of the true count plus one. The true count plus one is equivalent to the complement of the true count whereby the complement is meant the 9's complement of the four least significant digits and the binary complement of the 10,000 bit. Beginning with count 40,000 and until blanking (at count 60,000), the number displayed must be negative and corresponds to $0 > E_{in} > -1.9999$ v.d.c. For such magnitudes, the number displayed may be regarded as the quantity 40,000 minus the true count. The following table illustrates such operation for various values of $E_{in}$, including the typical values $E_{in} = + 1.0000$ v.d.c. and $E_{in} = -1.0000$ v.d.c.:

| $E_{in}$ | Count | Display | Meaning |
|---|---|---|---|
| +2.0000v. | 19.999 | +1. | =Digits Blank |
| +1.9999v. | 20,000 | +1.9999 | |
| +1.5000v. | 24,999 | +1.5000 | |
| +1.0000v. | 29,999 | +1.0000 | Display 40,000 - (Count) |
| +0.5000v. | 34,999 | + .5000 | |
| $+0.0001<E_{in}<ov.$ | 39,999 | + .0000 | |
| $0<E_{in}<-.001v.$ | 40,000 | − .0000 | |
| −0.5000v. | 45,000 | − .5000 | |
| −1.0000v. | 50,000 | −1.0000 | Display 40,000 - (Count) |
| −1.5000v. | 55,000 | −1.5000 | |
| −1.9999v. | 59,999 | −1.9999 | |
| −2.0000v. | 60,000 | −1. | Digits Blank |

While integrated circuit devices of discrete commercial types as described (such as those employing transistor-transistor logic) may be employed, it will be apparent that digital circuitry of the converter may take the form of one or more circuit devices employing large scale integration (LSI) of various logic types. Multiplex display techniques of the type familiar to those skilled in the art may also be used.

In view of the foregoing, it will be seen that the several objects of the invention are achieved and other advantageous results are attained.

As various changes could be made in the converter circuitry herein described without departing from the scope of the invention, it is intended that all matter contained in the foregoing description or shown in the accompanying drawing shall be interpreted as illustrative rather than in a limiting sense.

What is claimed is:

1. A bipolar dual-slope analog-to-digital converter system for converting an analog input signal of unknown polarity to a decimal number which is directly proportional to said analog input signal, said system comprising:

a. an integrator for providing an output signal which is proportional to the time integral of the magnitude with respect to a single analog reference of preselected magnitude and polarity of signal applied to the input thereof;

b. solid state switching means for alternately connecting to the input of said integrator either a first signal corresponding to an analog input signal of unknown magnitude and of either positive or negative polarity or a second signal constituting said single analog reference;

c. a pulse generator for supplying pulses at a substantially constant pulse repetition rate;

d. a digital counter for counting said pulses;

e. automatic means for effecting determination of the polarity of said analog input signal without polarity sensing of said analog input signal and for effecting display of a decimal number which is directly proportional to said analog input signal regardless of the polarity thereof, said automatic means comprising:

1. means for resetting said counter to a predetermined first count and for causing said switching means to apply one of said first and second signals to the input of said integrator whereby the output signal from said integrator increases linearly with respect to time from a reset value while said counter advances from said first count to a predetermined second count;

2. means responsive to said second count for causing said switching means to apply the other of said first and second signals to the input of said integrator whereby the output signal from said integrator decreases linearly with respect to time toward said reset value while said counter advances from said second count toward a predetermined third count, said reset value being reached prior to said third count if said first signal is of a first polarity and said reset value being reached after said third count if said first signal is of opposite polarity;

3. digital display means;

4. complement count means for causing said digital display means to display a decimal number corresponding to the complement of the count in said counter upon the output signal from said integrator reaching said reset value prior to said third count; and

5. true count means responsive to said counter reaching said third count for causing said digital display means to display a decimal number corresponding to the true count in said counter upon the output signal from said integrator reaching said reset value, whereby the decimal number displayed by said display means digitally represents the true magnitude of said analog input signal regardless of the polarity thereof.

2. A bipolar analog-to-digital converter system as set forth in claim 1 further comprising means for maintaining said reset value of the integrator output signal substantially precisely in a steady state condition following decrease of the integrator output signal to said reset value until said counter is reset to said predetermined first count.

3. A bipolar analog-to-digital converter system as set forth in claim 1 wherein said means for resetting said counter comprises pulse generating means for supplying reset pulses to said solid state switching means.

4. A bipolar analog-to-digital converter system as set forth in claim 1 further comprising overrange detecting means for causing said digital display means to provide overrange indication when said analog input signal is of an overrange magnitude greater than can be represented by said digital display means.

5. A bipolar analog-to-digital converter system as set forth in claim 1 wherein said counter is a binary coded decimal counter.

6. A bipolar analog-to-digital converter system as set forth in claim 5 wherein said true count means comprises latch means for transferring a count in said counter to said digital display means.

7. A bipolar analog-to-digital converter system as set forth in claim 6 wherein said complement count means comprises nines-complement circuitry interconnected with said latch means for causing transferring of a complemented count in said counter to said digital display means.

8. A bipolar analog-to-digital converter system as set forth in claim 7 including multiplex means selectively responsive to binary coded signals from either said latch means or said nines-complement circuitry, and means interconnected with said counter and said multiplex means causing selective operation of said multiplex means in response to said third count.

9. A bipolar analog-to-digital converter system as set forth in claim 1 further comprising polarity detecting means for causing display of a first polarity sign by said digital display means in response to a predetermined count in said counter and an opposite polarity sign in response to another predetermined count in said counter.

10. A bipolar analog-to-digital converter system as set forth in claim 1 wherein said digital display means comprises a numeric readout having a plurality of electroluminescent numeric indicators.

11. A bipolar analog-to-digital converter system as set forth in claim 10 wherein said numeric indicators comprise respective multi-segment LED display devices.

12. A bipolar dual-slope analog-to-digital converter system for converting an analog input signal of unknown polarity to a decimal number which is directly proportional to said analog input signal, said system comprising:

a. an integrator for providing an output signal which is proportional to the time integral of the magnitude, with respect to a single analog reference of preselected magnitude and polarity, of a signal applied to the input thereof;

b. solid state switching means for alternately connecting to the input of said integrator either a first signal corresponding to an analog input signal of unknown magnitude and of either positive or negative polarity or a second signal constituting said single analog reference;

c. a pulse generator for supplying pulses at a substantially constant pulse repetition rate;

d. a digital counter for counting said pulses;

e. automatic means for effecting the display of a decimal number which is directly proportional to said analog input signal regardless of the polarity thereof, said automatic means comprising:

1. means for periodically resetting said counter to a predetermined first count and for causing said switching means to apply said first signal to the input of said integrator whereby the output signal from said integration increases linearly with respect to time from a reset value while said counter advances from said first count to a predetermined second count; and
2. means responsive to said second count for causing switching means to apply said second signal to the input of said integrator whereby the output signal from said integrator decreases linearly with respect to time toward said reset value while said counter advances from said second count toward a predetermined third count, said reset value being reached prior to said third count for a first polarity analog input signal said reset value being reached after said third count for an opposite polarity analog input signal;
3. digital display means; and
4. count responsive means including complement count means for causing said digital display to display a decimal number corresponding to the complement of the count in said counter upon the output signal from said integrator reaching said reset value; and true count means for causing said digital display means to display a decimal number corresponding to the true count in said counter upon the output signal from said integral reaching said reset value; and means responsive to said counter reaching said third count for disabling said complement count means and enabling said true count means; whereby the decimal number displayed by said display means digitally represents and is directly proprotional to the true magnitude of said analog input signal regardless of the polarity thereof.

13. A bipolar analog-to-digital converter system as set forth in claim 12 further comprising:

means for detecting said reset value of the integrator output signal; and clamp means for causing said reset value to be maintained substantially precisely in a steady state condition after said reset value is reached following decrease of the integrator output signal until said counter is reset to said predetermined first count.

14. A bipolar analog-to-digital converter system as set forth in claim 13 wherein:

said means for detecting said reset value comprises a voltage comparator connected to the output of said integrator; and said clamp means comprises a feedback circuit including a diode interconnected between an output of said comparator and an input of said integrator.

15. A bipolar analog-to-digital converter system as set forth in claim 14 wherein:

said voltage comparator is connected for providing a pulse waveform output signal upon said integrator output signal reading said reset value, and said feedback circuit includes a damping network for critical damping of the feedback signal provided by said feedback circuitry whereby said pulse waveform output signal constitutes a single pulse.

16. A bipolar analog-to-digital converter system as set forth in claim 12 wherein said means for resetting said counter comprises pulse generating means interconnected with said switching means and said counter and adapted for periodically supplying reset pulses at a rate much less than said constant pulse repetition rate.

17. A bipolar analog-to-digital converter system as set forth in claim 12 further comprising overrange detecting means for providing indication of said analog input signal of an overrange magnitude greater than a preselected value which can be represented by said digital display means.

18. A bipolar analog-to-digital converter system as set forth in claim 17 wherein said overrange detecting means causes blanking of digits of said digital display means thereby to indicate that said input signal is of overrange magnitude.

19. A bipolar analog-to-digital converter system as set forth in claim 18 wherein said overrange detecting means comprises:

a flip-flop having a first state permitting display by said digital display means and a second state causing said blanking of digits; and means interconnected with said counter for causing said flip-flop to assume said first state in response to a predetermined fourth count in said counter and to assume said second state in response to a predetermined fifth count in said counter, said blanking of digits occurring if the reset value of said integrator is not reached after said fourth count and prior to said fifth count.

20. A bipolar analog-to-digital converter system as set forth in claim 12 wherein said digital counter comprises a binary coded decimal counter having a plurality of decades corresponding to respective digits of said decimal number.

21. A bipolar analog-to-digital converter system as set forth in claim 20 wherein said count-responsive means comprises a plurality of latch circuits corresponding to respective ones of said decades, said latch circuits being concomitantly operable upon the output signal from said integrator reaching said reset value to transfer the count in said counter to either said complement count means or said true count means.

22. A bipolar analog-to-digital converter system as set forth in claim 21 wherein said complement count means comprises a plurality of nines-complement circuits interconnected with respective ones of said latch circuits.

23. A bipolar analog-to-digital converter system as set forth in claim 22 wherein said means responsive to said counter reaching said third count comprises:

a plurality of multiplex circuits having inputs interconnected with respective ones of said latch circuits and said nines-complement circuits and outputs interconnected with said digital display means; and multiplex control means interconnected with said counter for causing concomitant operation of said multiplex circuits in response to said third count.

24. A bipolar analog-to-digital converter system as set forth in claim 12 further comprising polarity detecting means comprising:

a flip-flop having a first state causing display by said digital display means of a first polarity sign and a second state causing display by said digital display means of an opposite polarity sign; and means interconnected with said counter for causing said flip-flop to assume said first state in response to a predetermined first count in said counter and to assume said second state in response to said predetermined third count in said counter.

25. A bipolar analog-to-digital converter system as set forth in claim 12 wherein said integrator comprises:

an operational amplifier having inverting and non-inverting inputs, said first and second signals being supplied alternatively to said inverting input;

a capacitor connected in a circuit between the output of said operational amplifier and the inverting input thereof; and means for supplying to said non-inverting input a reference potential of preselected magnitude.

26. A bipolar analog-to-digital converter system as set forth in claim 25 wherein said preselected magnitude of the reference potential is greater than said first signal for any value of said analog input signal which is to be represented by said display means.

27. A bipolar analog-to-digital converter system as set forth in claim 26 wherein said second signal constituting an analog reference signal has a magnitude $V_r$, said reference potential has a magnitude $KV_R$ where K is a constant, said first signal has a magnitude $E_i$, K being chosen so that $E_i$ has an absolute value less than $KV_r$ within the operating range of $E_i$ and wherein said integrator integrates in a positive sense current proportional to $KV_R - E_i$ when said first signal is applied to said inverting input and said integrator integrates in a negative sense current proportional to $V_R(1-K)$ when said second signal is applied to said inverting input.

* * * * *